United States Patent
Ohana

(10) Patent No.: US 9,213,049 B2
(45) Date of Patent: Dec. 15, 2015

(54) POWER DEVICE INTERFACE ARRANGED TO DETECT AMOUNT OF POWER AVAILABLE

(71) Applicant: Microsemi Corp.—Analog Mixed Signal Group, Ltd., Hod Hasaron (IL)

(72) Inventor: Eli Ohana, Kfar Sava (IL)

(73) Assignee: Microsemi Corp.—Analog Mixed Signal Group, Ltd., Hod Hasharon (IL)

( * ) Notice: Subject to any disclaimer, the term of this patent is extended or adjusted under 35 U.S.C. 154(b) by 350 days.

(21) Appl. No.: 13/742,377

(22) Filed: Jan. 16, 2013

(65) Prior Publication Data

US 2013/0187632 A1  Jul. 25, 2013

Related U.S. Application Data

(60) Provisional application No. 61/589,884, filed on Jan. 24, 2012.

(51) Int. Cl.
*G06F 15/177* (2006.01)
*G01R 21/00* (2006.01)
*H04L 12/10* (2006.01)

(52) U.S. Cl.
CPC .............. *G01R 21/00* (2013.01); *H04L 12/10* (2013.01)

(58) Field of Classification Search
None
See application file for complete search history.

(56) References Cited

U.S. PATENT DOCUMENTS

| | | | |
|---|---|---|---|
| 4,296,375 A * | 10/1981 | Takezaki | 324/103 P |
| 6,473,608 B1 * | 10/2002 | Lehr et al. | 455/402 |
| 7,492,059 B2 * | 2/2009 | Peker et al. | 307/71 |
| 8,782,442 B2 * | 7/2014 | Woo et al. | 713/300 |
| 2007/0206749 A1 * | 9/2007 | Pincu et al. | 379/142.1 |
| 2007/0296394 A1 * | 12/2007 | Landry et al. | 323/371 |
| 2008/0162973 A1 * | 7/2008 | Landry et al. | 713/340 |
| 2009/0077401 A1 | 3/2009 | Tsai | |
| 2009/0088908 A1 * | 4/2009 | Karam | 700/297 |
| 2010/0293399 A1 * | 11/2010 | Landry et al. | 713/300 |
| 2011/0163605 A1 * | 7/2011 | Ronen et al. | 307/71 |
| 2012/0011380 A1 * | 1/2012 | Dove | 713/300 |
| 2013/0076133 A1 * | 3/2013 | Gammel et al. | 307/31 |
| 2013/0191655 A1 * | 7/2013 | Schlichter | 713/300 |

OTHER PUBLICATIONS

HDBaseT Specification Version 1.1.0, pp. 151-187, published Jul. 12, 2011, HDBaseT Alliance.
IEEE 802.3af-2003 Specification, pp. 29-57, 94-96, 102, 115, published 2003 by IEEE, New York.
IEEE 802.3at-2009 Specification, pp. 22-67, published 2009 by IEEE, New York.
Office Action Dated Mar. 5, 2015 from the Intellectual Property Office, Taiwan, for parallel application TW 102100876.

* cited by examiner

*Primary Examiner* — Vincent Tran
(74) *Attorney, Agent, or Firm* — Simon Kahn

(57) ABSTRACT

A powered device interface arranged as an interface between power received over a structured communication cabling and a powered device, the powered device interface constituted of: a class event counter; a logic circuit in communication with the class event counter; and a plurality of flag outputs each responsive to the logic circuit, each of the flag outputs associated with a predetermined powering level of a power sourcing equipment connected over the structured communication cabling, the logic circuit arranged to: output an active signal at the flag output associated with a detected powering level of the connected power sourcing equipment; and output an active signal at all other flag outputs associated with powering levels less than the detected powering level of the connected power sourcing equipment.

11 Claims, 8 Drawing Sheets

POWER DEVICE INTERFACE ARRANGED TO DETECT AMOUNT OF POWER AVAILABLE

CROSS-REFERENCE TO RELATED APPLICATION

This applications claims priority from U.S. Provisional Patent Application Ser. No. 61/589,884 filed Jan. 24, 2012, of the same title, the entire contents of which is incorporated herein by reference.

BACKGROUND OF THE INVENTION

The present invention relates to power over Ethernet, and in particular to a powered device arranged to detect the type of power sourcing equipment connected thereto, and output a flag indicative of the amount of available power.

BACKGROUND OF THE INVENTION

Power over Ethernet (PoE), in accordance with both IEEE 802.3af-2003 and IEEE 802.3at-2009, each published by the Institute of Electrical and Electronics Engineers, Inc., New York, the entire contents of which is incorporated herein by reference, defines delivery of power over a set of 2 twisted wire pairs without disturbing data communication. The aforementioned standards particularly provide for a power sourcing equipment (PSE) and a powered device (PD). The power sourcing equipment is configured to detect the PD by ascertaining a valid signature resistance, and to supply power over the 2 twisted wire pairs only after a valid signature resistance is actually detected.

U.S. patent Ser. No. 7,492,059 issued Feb. 17, 2009 to Peker et al, the entire contents of which is incorporated herein by reference is addressed to powering a PD over 4 twisted pairs. Such a technique provides for increased power as compared to either of the above mentioned standards, and is commercially available from Microsemi Corporation of Alisa Viejo, Calif.

The HD BaseT Alliance of Beaverton Oregon has published the HDBaseT Specification Version 1.1.0 which defines a high power standard utilizing twisted pair cabling, such as Category 5e (CAT 5e) or Category 6 (CAT 6) structured cabling as defined by ANSI/TIA/EIA-568-A. The specification provides for even higher power than the above mentioned IEEE 802.3at-2009 over each set of 2 pairs, with all 4 pairs utilized for powering, and allows for power over structured communication cabling from any of: a type 1 PSE, denoted hereinafter as a low power PSE; a type 2 PSE denoted hereinafter as a medium power PSE; a type 3 PSE, denoted hereinafter as a high power PSE; twin medium power PSEs; and twin high power PSEs.

Detection, in accordance with any of the above standards requires the supply of at least 2 voltage levels between the range of 2.8 volts and 10 volts, with a signature resistance of the PD determined based on a calculation of the actual voltage levels, or current, detected. The use of 2 voltage levels allows for determination of the signature resistance irrespective of the existence of a diode bridge, typically supplied at the input to the PD.

A plurality of techniques are thus available for providing power over Ethernet cabling such as CAT 5e or CAT 6. A PD with a particular power requirement may find itself connected to a PSE supporting a power requirement in excess of its needs, in which case it may be powered, or alternately to a PSE not supporting sufficient power to meet its requirements. Various schemes to identify the power available from the PSE are known, such as those described in U.S. Patent Application Publication S/N US 2011/0163605 A1 published Jul. 7, 2011 to Ronen, the entire contents of which is incorporated herein by reference.

Many PD manufacturers prefer to focus their engineering resources on the functional aspects of the PD and purchase a PD interface which is arranged to receive the PoE and act in accordance with one or more of the above described techniques, while providing a power output for use with the PD. The range of power limitations however leads to a situation where complex communication is required between the PD and the PD interface in order to determine if sufficient power is available from the PSE to actual power the PD.

SUMMARY OF THE INVENTION

Accordingly, it is a principal object of the present embodiments to overcome at least some of the disadvantages of the prior art. This is provided in certain embodiments by providing a PD interface having a class event counter, a logic circuitry and a plurality of flag outputs each associated with a particular PSE powering level. The logic circuit determines the power level available from an attached PSE responsive to the class event counter and asserts the flag associated with the power availability, and all flags associated with power availability less than the power availability. A PD with a predetermined power requirement thus needs only monitor the flag associated with its powering requirement, since in the event that additional power is available its flag will be asserted.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

Figure 1A:
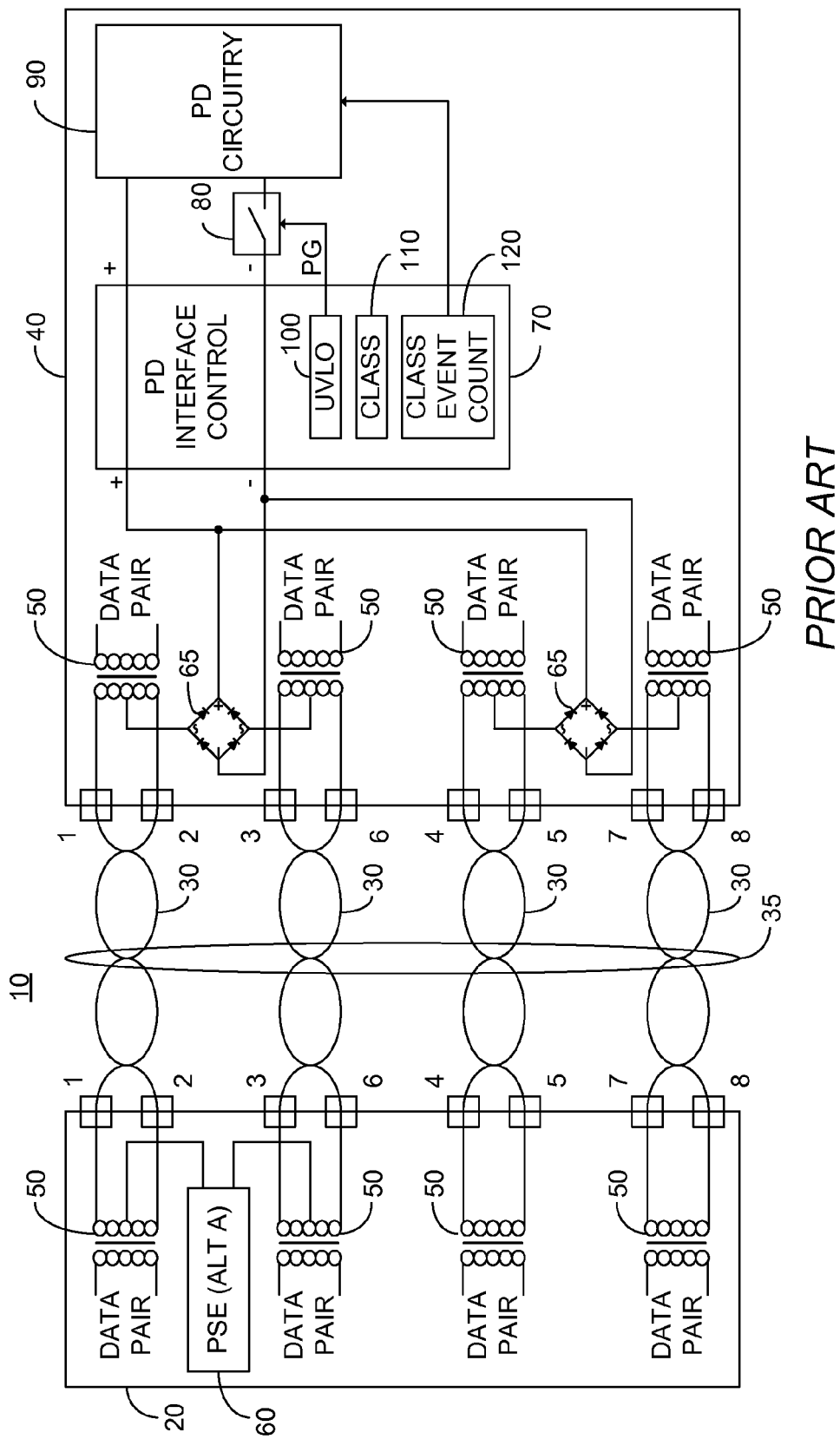
FIG. 1A illustrates a high level schematic diagram of an alternative A PoE powering arrangement utilizing 2 twisted pairs to provide power from a PSE to a PD in accordance with the prior art.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1A illustrates a high level schematic diagram of an alternative A PoE powering arrangement 10, according to the prior art, comprising: a switch/hub 20; a plurality of twisted pairs 30 constituted within a structured cable 35; and a PD 40. Switch/hub 20 comprises a plurality of data transformers 50 and a PSE 60. PD 40 comprises: a plurality of data transformers 50; a first and a second diode bridge 65; a PD interface 70; an electronically controlled switch 80; and a PD load circuitry 90. PD interface 70 comprises: an under-voltage lockout circuit (UVLO) 100; a class current source 110; and a class event counter 120. A data pair is connected across the primary of each data transformer 50 in switch/hub 20 and a first end of each twisted pair 30 is connected across the secondary of each data transformer 50 in switch/hub 20 via respective connections, listed conventionally in two groups: connections 1, 2, 3, 6; and connections 4, 5, 7 and 8. The outputs of PSE 60 are respectively connected to the center taps of the secondary windings of data transformers 50 of switch/hub 20 connected to twisted pairs 30 via connections 1, 2, 3 and 6. Structured cable 35 typically comprises 4 twisted pairs 30.

A data pair is connected across the primary of each data transformer 50 in PD 40 and a second end of each twisted pair 30 is connected across the secondary of each data transform 50 in PD 40 via respective connections, listed conventionally in two groups: connections 1, 2, 3, 6; and connections 4, 5, 7 and 8. The inputs of first diode bridge 65 are respectively connected to the center taps of the secondary windings of data transformers 50 of PD 40 connected to twisted pairs 30 via connections 1, 2, 3 and 6. The inputs of second diode bridge 65 are respectively connected to the center taps of the secondary windings of data transformers 50 of PD 40 connected to twisted pairs 30 via connections 4, 5, 7 and 8. The positive outputs of first and second diode bridges 65 are commonly connected to the positive input of PD interface 70, and the returns of first and second diode bridges 65 are commonly connected to the return of PD interface 70. PD interface 70 is illustrated as having a pass through connection from the positive input to the positive output thereof, and power for each of UVLO 100, class current source 110 and class event counter 120 are provided there from (not shown). PD interface 70 is illustrated as having a pass through connection from the return input to the return output thereof, and a return for each of UVLO 100, class current source 110 and class event counter 120 are provided there from (not shown). Electronically controlled switch 80 is arranged to provide a switchable connection between the return of PD load circuitry 90 and PD interface 70, and electronically controlled switch 80 is responsive to an output of UVLO 100, indicative that received power is reliable and is denoted PG. The positive input of PD load circuitry 90 is connected to the positive output of PD interface 70.

Powering arrangement 10 has been illustrated in an embodiment wherein electronically controlled switch 80 is connected in the return path, however this is not meant to be limiting in any way, and is simply meant as a depiction of one embodiment of alternative A powering known to those skilled in the art. Similarly, PSE 60 is illustrated as being part of switch/hub 20 however this is not meant to be limiting in any way, and midspan equipment may be utilized to provide a connection for PSE 60 without exceeding the scope. PSE 60 may be any equipment arranged to provide power over communication cabling, including equipment meeting the definition of a PSE under any of IEEE 802.3af; IEEE 802.3at; and the above mentioned HDBaseT specification, without limitation.

In operation, electronically controlled switch 80 is initially set to isolate PD load circuitry 90 from PSE 60. PSE 60 detects PD 40 via a detection resistance presented by PD interface 70 (not shown), and after detection, optionally presents a classification voltage to PD 40. Class current source 110 is arranged to drive a predetermined current indicative of the power requirements of PD load circuitry 90 responsive to the presented classification voltage, thus indicating to PSE 60 the power requirements thereof Optionally, PSE 60 further provides PD 40 with information regarding the powering ability of PSE 60 by providing a plurality of classification events separated by mark events, with the information provided by the number of classification events. The mark events function to define the individual classification events. Class event counter 120 is arranged to count the classification events and output information regarding the counted classification events to PD load circuitry 90, thus providing PD load circuitry 90 with information regarding the powering ability of PSE 60. In further detail, in the event PSE 60 is in accordance with the above mentioned IEEE802.3at -2009 specification, 2 event physical layer classification is optionally implemented and in the event PSE 60 is in accordance with the above mentioned HDBaseT specification up to 3 event physical layer classification is implemented, with the number of events indicating the power capability of PSE 60.

In one embodiment PD load circuitry 90 is arranged to operate at a plurality of power levels, such as described in U.S. Pat. No. 6,473,608 issued Oct. 29, 2002 to Lehr et al, the entire contents of which is incorporated herein by reference. In such an embodiment PD load circuitry 90 utilizes power responsive to the power available as indicated by the number of class events output by PSE 60. In such an embodiment however, PD load circuitry 90 must further be provided with circuitry to translate the information received from class event counter 120 into powering level information.

PSE 60 is further arranged, in the event that sufficient power is available to support the power requirements indicated by the classification current of class current source 110, to provide operating power for PD 40 over 2 twisted wire pairs 30 of structured cable 35 by raising the voltage above the classification voltage range. First diode bridge 65 is arranged to ensure that power received by PD interface 70 and PD load circuitry 90 is at a predetermined polarity irrespective of the connection polarity of PSE 60. UVLO 100 is arranged to maintain isolation between PSE 60 and PD load circuitry 90 until a predetermined operating voltage has been achieved across PD interface 70, and upon sensing the predetermined operating voltage UVLO 100 is further arranged to assert output PG thus closing electronically controlled switch 80 thereby providing power to PD circuit 90. Optionally, a timer (not shown) may be provided to ensure that the startup phase is complete prior to closing electronically controlled switch 80.

Figure 1B:
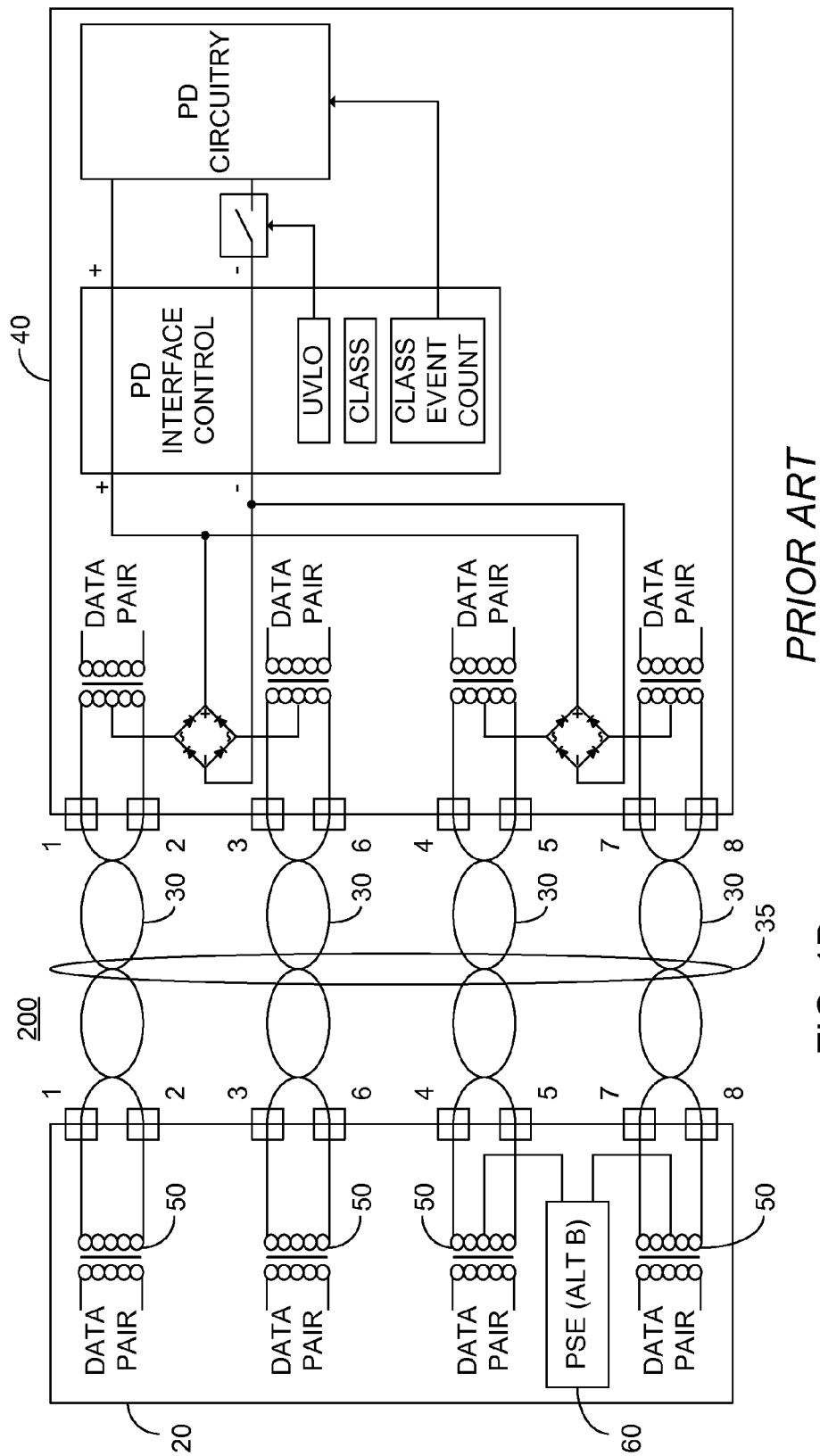
FIG. 1B illustrates a high level schematic diagram of an alternative B PoE powering arrangement utilizing 2 twisted pairs to provide power from a PSE to a PD in accordance with the prior art.

FIG. 1B illustrates a high level schematic diagram of an alternative B PoE powering arrangement 200, according to the prior art, comprising: a switch/hub 20; a plurality of twisted pairs 30 constituted within a structured cable 35; and a PD 40. Alternative B PoE powering arrangement 200 is in all respects identical to alternative A PoE powering arrangement 10 with the exception that the outputs of PSE 60 are respectively connected to the center taps of the secondary windings of data transformers 50 of switch/hub 20 connected to twisted pairs 30 via connections 4, 5, 7 and 8. The operation of alternative B PoE powering arrangement 200 is in all respects identical to alternative A PoE powering arrangement 10, and in the interest of brevity will not be further detailed.

Figure 1C:
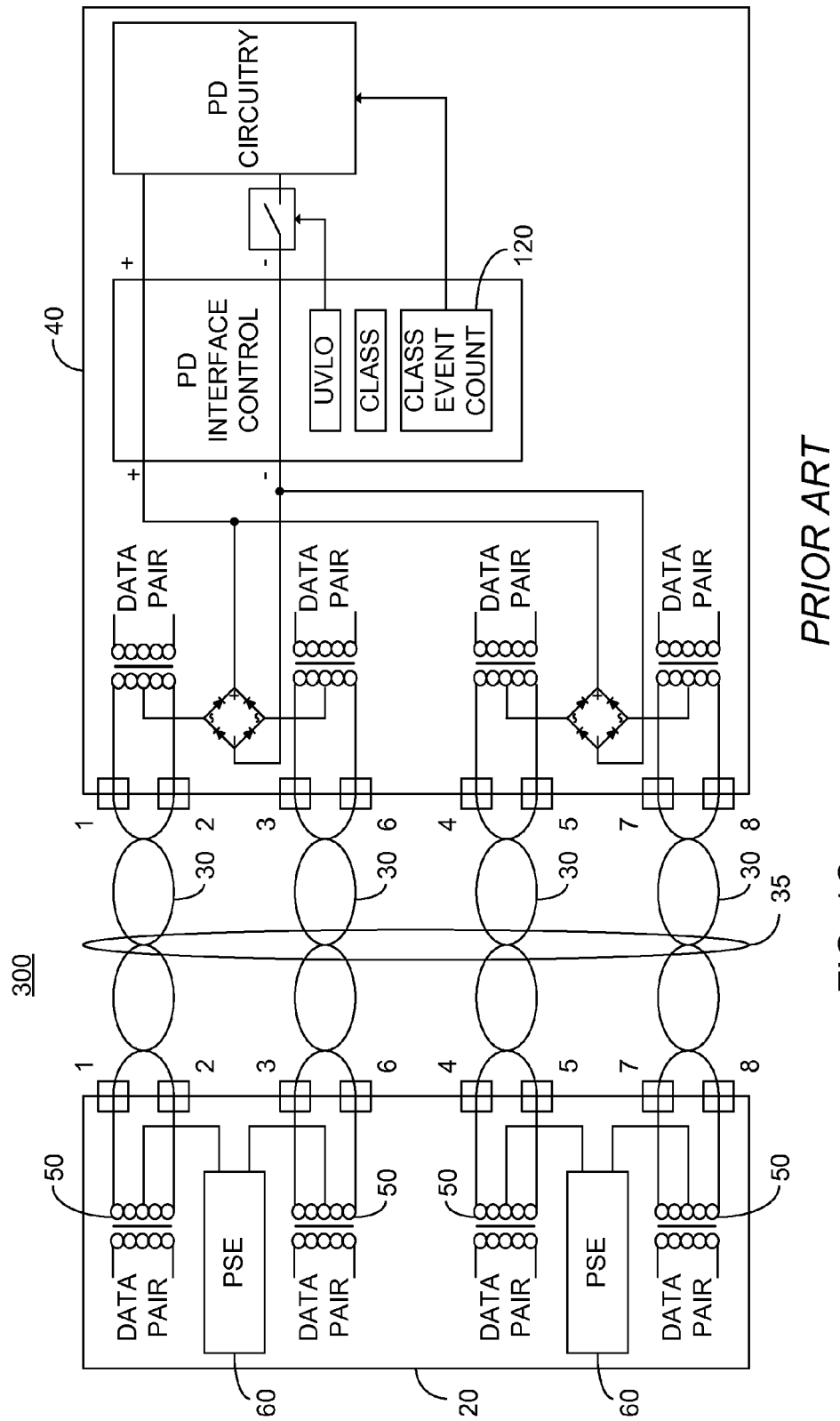
FIG. 1C illustrates a high level schematic diagram of a PoE powering arrangement utilizing twin PSEs to provide power to a PD over 4 twisted pairs in accordance with the prior art.

FIG. 1C illustrates a high level schematic diagram of a PoE powering arrangement 300 utilizing twin PSEs to provide power to a PD over 4 twisted pairs, in accordance with the prior art, comprising: a switch/hub 20; a plurality of twisted pairs 30 constituted within a structured cable 35; and a PD 40. PoE powering arrangement 300 is in all respects identical to alternative A PoE powering arrangement 10 and alternative A PoE powering arrangement 10 with the exception that a first and a second PSE 60 are supplied, known as twin PSEs, the outputs of first PSE 60 respectively connected to the center taps of the secondary windings of data transformers 50 of switch/hub 20 connected to twisted pairs 30 via connections 1, 2, 3 and 6 and the output of second PSE 60 connected to the center taps of the secondary windings of data transformers 50 of switch/hub 20 connected to twisted pairs 30 via connections 4, 5, 7 and 8. The operation of PoE powering arrangement 300 is in all respects identical to alternative A PoE powering arrangement 10 and alternative B PoE powering arrangement 200 with the exception that power is supplied by each of first PSE 60 and second PSE 60. Communication is preferably provided between the first and second PSE 60 so as to ensure coordinated operation. As indicated above there is no requirement for PSE 60 to provide class events for class event counter 120, unless PSE 60 meets the HD BaseT specification, and thus class event counter 120 may count any of: 1 class event in the event of a single low power PSE 60 or a single medium power PSE 60 not providing 2 class events; 2 class events in the event of a single medium power PSE 60 providing 2 class events; 3 class events in the event of a high power PSE 60; 4 class events in the event of twin medium power PSEs 60 each providing 2 class events; and 6 class event in the event of twin high power PSEs 60.

Figure 2:
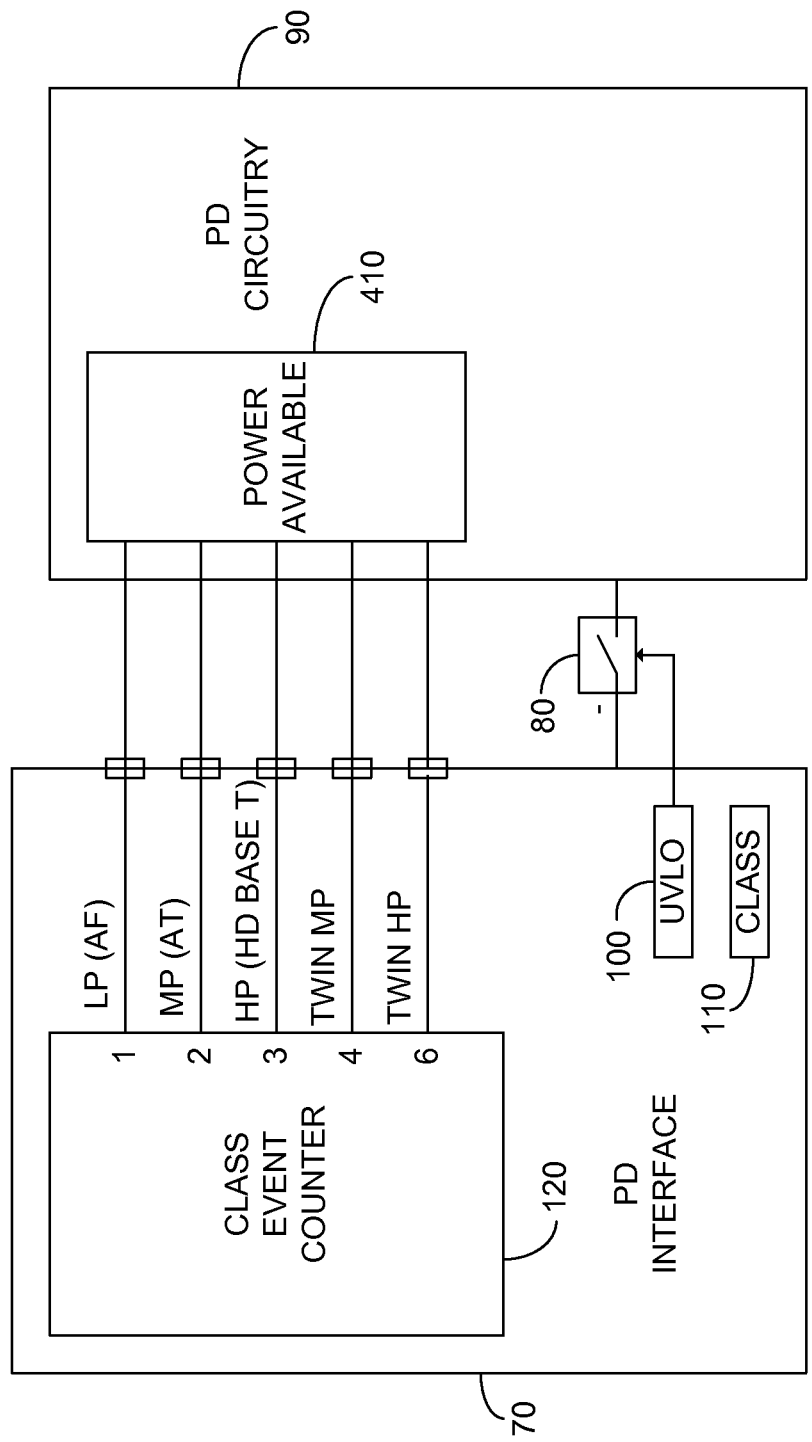
FIG. 2 illustrates a high level schematic diagram of a PD interface comprising a class event counter and a plurality of outputs each associated with a particular one of the outputs of the class event counter, in accordance with the prior art.

FIG. 2 illustrates a high level schematic diagram of a PD interface 70, in accordance with the prior art, comprising a class event counter 120 exhibiting a plurality of outputs each associated with a particular one of the outputs of class event counter 120. UVLO 100, class current source 110, electronically controlled switch 80 and PD load circuitry 90 comprising a power availability detector 410 are further illustrated. Power availability detector 410 exhibits a plurality of connections, each connected to a particular output of class event counter 120, thus requiring a total of 5 connections. In particular, and as described above, class event counter 120 may count any of: a single class event, and thus assert a low power flag; two class events and thus assert a medium power flag; three class events and thus assert a high power flag; four class events and thus assert a twin medium power flag; and six class events and thus assert a twin high power flag.

Power availability detector 410 is in one embodiment arranged to receive each of the low power flag, medium power flag, high power flag, twin medium power flag and twin high power flag, and thus receives information regarding the amount of power available. Disadvantageously, this requires a large number of connections. Alternately, power availability detector 410 may be connected to the desired output flag. Thus, in one non-limiting example, in the event that PD load circuitry 90 is arranged to function only in cooperation with medium power, power availability detector 410 is connected to receive the medium power flag. However, in the event that high power is available, PD load circuitry 90 will not function, despite the fact that sufficient power is available. Furthermore, as indicated above, in certain embodiments class event counter 120 is unable to provide precise information regarding the capabilities of PSE 60, since there is no requirement that a medium power PSE 60 support two class events.

Figure 3:
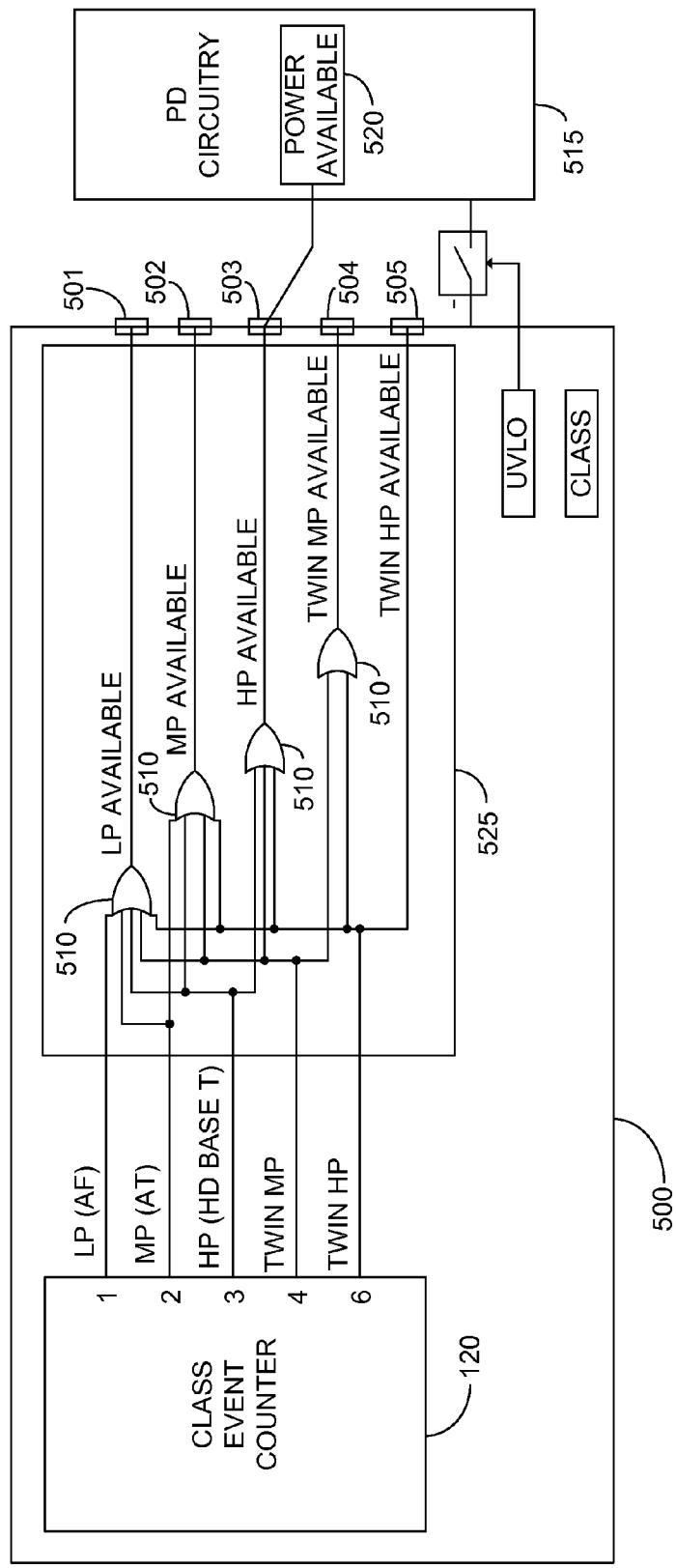
FIG. 3 illustrates a high level schematic diagram of an exemplary PD interface comprising a class event counter and a plurality of outputs each associated with a particular one of the outputs of the class event counter, wherein the type of attached PSE is detected and all flags associated with the power level available from the attached PSE and all flags associated with power availability less than the power availability are asserted.

FIG. 3 illustrates a high level schematic diagram of an exemplary PD interface 500 arranged to replace PD interface 70 of the prior art, and may be utilized in any of powering arrangements 100, 200 and 300. PD interface 500 comprises: a class event counter 120; a plurality of OR gates 510; and a plurality of outputs each associated with a particular one of the outputs of class event counter 120, wherein the type of attached PSE is detected and all flags associated with the detected power level available from the attached PSE and all flags associated with power availability less than the power availability are asserted. In particular, a plurality of outputs is provided for PD interface 500: a low power flag output 501; a medium power flag output 502; a high power flag output 503; a twin medium power flag output 504; and a twin high power flag output 505. Additionally, a PD load circuitry 515 is illustrated, comprising a power availability detector 520.

The single class event output of class event counter 120, denoted LP (AF), is connected to a first input of a first OR gate 510; the two class event output of class event counter 120, denoted MP (AT), is connected to a second input of first OR gate 510; the three class event output of class event counter 120, denoted HP (HD BASE T), is connected to a third input of first OR gate 510; the four class event output of class event counter 120, denoted TWIN MP, is connected to a fourth input of first OR gate 510; and the six class event output of class event counter 120, denoted TWIN HP, is connected to a fifth input of first OR gate 510. The output of first OR gate 510 is denoted LP AVAILABLE, and is connected to low power flag output 501.

The two class event output of class event counter 120 is further connected to a first input of a second OR gate 510, the three class event output of class event counter 120 is further connected to a second input of second OR gate 510, the four class event output of class event counter 120 is further connected to a third input of second OR gate 510 and the six class event output of class event counter 120 is further connected to a fourth input of second OR gate 510. The output of second OR gate 510 is denoted MP AVAILABLE, and is connected to medium power flag output 502.

The three class event output of class event counter 120 is further connected to a first input of a third OR gate 510, the four class event output of class event counter 120 is further connected to a second input of third OR gate 510 and the six class event output of class event counter 120 is further connected to a third input of third OR gate 510. The output of third OR gate 510 is denoted HP AVAILABLE, and is connected to high power flag output 503.

The four class event output of class event counter 120 is further connected to a first input of a fourth OR gate 510 and the six class event output of class event counter 120 is further connected to a second input of fourth OR gate 510. The output of fourth OR gate 510 is denoted twin MP available, and is connected to a respective output of twin medium power flag output 504. The six class event output of class event counter 120 is further denoted twin HP AVAILABLE, and is connected to twin high power flag output 505. The combination of first through fourth OR gates 510, and the respective connections to both class event counter 120 and the respective output connections together form logic circuit 525.

PD interface 500 is thus arranged to ouput, responsive to logic circuit 525: flag LP AVAILABLE which is asserted whenever at least low power, such as power according to IEEE 802.3af is available; flag MP AVAILABLE which is asserted whenever at least medium power, such as power according to IEEE 802.3at is available; flag HP AVAILABLE which is asserted whenever at least high power, such as power according to HDBaseT with a single high power PSE 60 is available; flag twin MP AVAILABLE which is asserted whenever at least twin medium power, such as power according to HDBaseT with twin medium power PSEs 60 is available; and twin HP AVAILABLE when twin high power PSEs 60 according to HDBaseT is available. Thus, an active signal is output at the flag output associated with the detected powering level of PSE 60 and at all other flag outputs associated with powering levels less than the detected powering level of PSE 60.

In one embodiment, power availability detector 520 is arranged to be coupled to the appropriate output of PD interface 500, thus requiring only a single connection between PD load circuitry 515 and PD interface 500 to provide complete information regarding whether sufficient power for full operation is available. In the event PD load circuitry 90 requires low power, power availability detector 520 is coupled to low power flag output 501. In the event PD load circuitry 90 requires medium power, power availability detector 520 is coupled to medium power flag output 502. In the event PD load circuitry 90 requires high power, power availability detector 520 is coupled to high power flag output 503. In the event PD load circuitry 90 requires twin medium power, power availability detector 520 is coupled to twin medium power flag output 504. In the event PD load circuitry 90 requires twin high power, power availability detector 520 is coupled to twin high power flag output 505. In another embodiment (not shown), power availability detector 520 exhibits a plurality of inputs, each input coupled to a particular output of PD interface 500.

The above has been described in accordance with the powering levels in accordance with IEEE 802.3af, IEEE802.3at and HDBaseT, however this is not meant to be limiting in any way, and the principles described herein may be applied to any powering scheme where a plurality of levels are available without exceeding the scope.

The above has been described in an embodiment wherein LP AVAILABLE is asserted responsive to the detection of a single finger, however this is not meant to be limiting in any way. In another embodiment, no flag is asserted in the absence of at least 2 finger detection and in such an embodiment PD interface 500 determines power availability to be of low power, i.e. a type 1 PSEE.

Additionally, in various embodiments a power good signal (not shown) is further developed, responsive to sufficient voltage being developed across an input capacitor of a DC/DC converter of PD circuitry 515. The respective flags, described above, are read by PD circuitry 515, particularly by power availability detector 520, upon assertion of the power good signal, and the DC/DC converter is further enabled.

Figure 4:
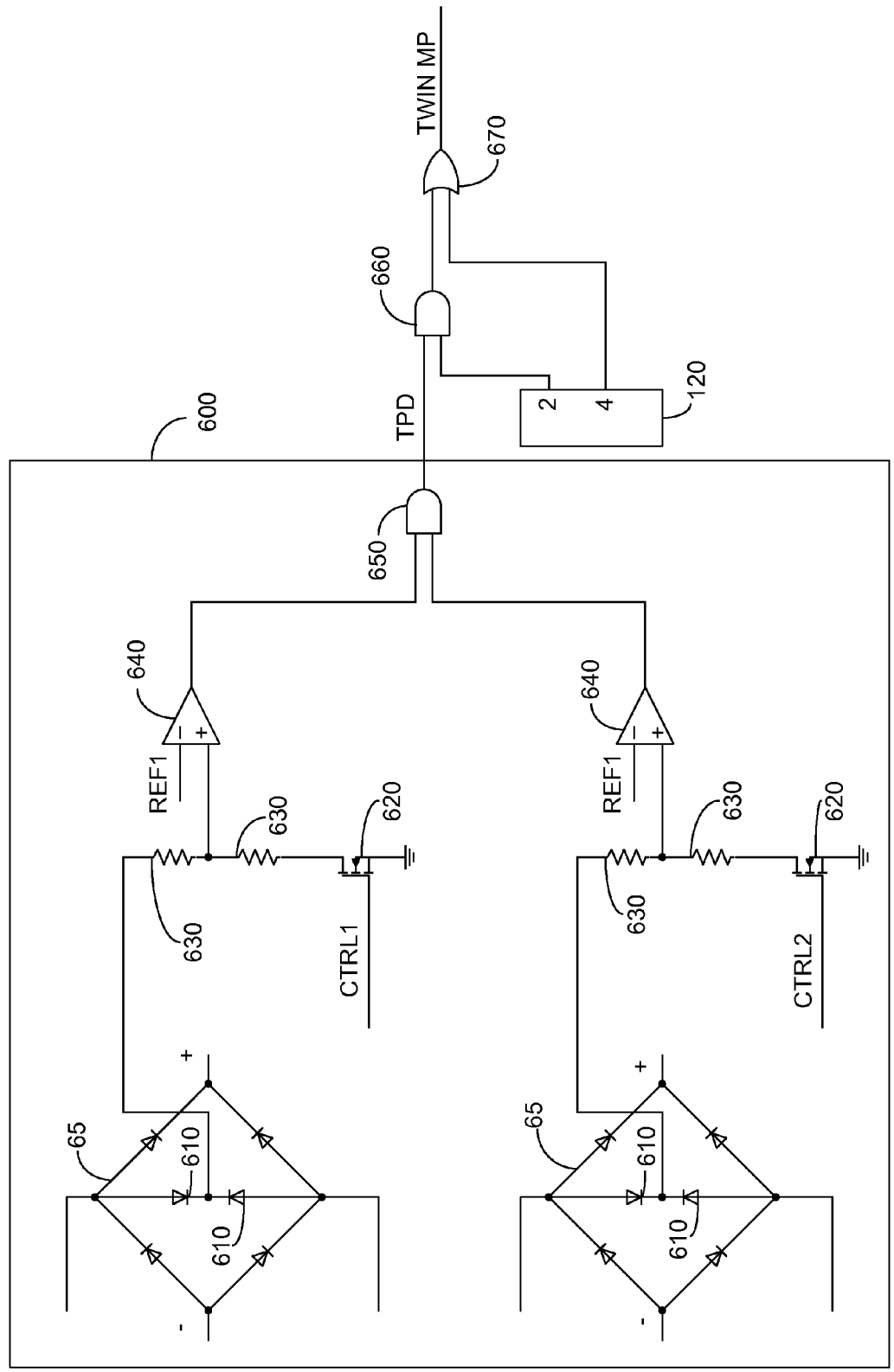
FIG. 4 illustrates a high level schematic diagram of an exemplary twin power detection circuit arranged to detect powering by a twin PSE.

FIG. 4 illustrates a high level schematic diagram of an exemplary twin power detection circuit 600 arranged to detect powering by a twin PSE, the output of twin power detection circuit 600 logically combined with the two and four event counter outputs of class event counter 120 to provide a TWIN MP input to OR gates 510 of FIG. 3. As described above, there is no requirement that twin PSEs provide timed classification which allows for proper counting by class event counter 120, and thus identification of powering appearing across all twisted wire pairs 30 is advantageous, particularly as described further hereinto below.

Twin power detection circuit 600 comprises: a pair of diode bridges 65; a plurality of unidirectional electronic valves 610; a pair of electronically controlled switches 620, each illustrated without limitation as an n-channel MOSFET; a plurality of resistors 630; a pair of comparators 640; and an AND gate 650. Further illustrated in FIG. 4 is an AND gate 660; an OR gate 670; and a class event counter 120. The connections of diode bridges 65 are as described above in relation to FIGs. 1A-1C and in the interest of brevity will not be described again. The anode of a first unidirectional electronic valve 610 is connected to a first input of a first diode bridge 65 which is connected to a first twisted pair, as described above. The anode of a second unidirectional electronic valve 610 is connected to a second input of first diode bridge 65 which is connected to a second twisted pair, as described above. The cathode of each of first and second unidirectional electronic valves 610 are connected to a first end of a first resistor 630. A second end of first resistor 630 is connected to the non-inverting input of a first comparator 640 and to a first end of a second resistor 630. A second end of second resistor 630 is connected to the drain of a first electronically controlled switch 620 and the source of first electronically controlled switch 620 is connected to a common point. The gate of first electronically controlled switch 620 is connected to a control input, denoted CTRL1, and the inverting input of first comparator 640 is connected to a reference voltage, denoted REF1. The output of first comparator 640 is connected to a first input of AND gate 650.

The anode of a third unidirectional electronic valve 610 is connected to a first input of a second diode bridge 65 which is connected to a third twisted pair, as described above. The anode of a fourth unidirectional electronic valve 610 is connected to a second input of second diode bridge 65 which is connected to a fourth twisted pair, as described above. The cathode of each of third and fourth unidirectional electronic valves 610 are connected to a first end of a third resistor 630. A second end of third resistor 630 is connected to the non-inverting input of a second comparator 640 and to a first end of a fourth resistor 630. A second end of fourth resistor 630 is connected to the drain of a second electronically controlled switch 620 and the source of second electronically controlled switch 620 is connected to the common point. The gate of second electronically controlled switch 620 is connected to a control input, denoted CTRL2, and the inverting input of second comparator 640 is connected to reference voltage denoted REF1. The output of second comparator 640 is connected to a second input of AND gate 650. Control inputs CTRL1 and CTRL2 are connected to a control circuitry (not shown) and are arranged to open and close the respective electronically controlled switch 620.

The output of AND gate 650, denoted TPD, is connected to a first input of AND gate 660 and a second input of AND gate 660 is connected to the two event counter output of event counter 120. The output of AND gate 660 is connected to a first input of OR gate 670 and a second input of OR gate 670 is connected to the four event counter output of event counter 120. The output of OR gate 670 is denoted TWIN MP and is connected to a respective OR gate, as described above in relation to FIG. 3. CTRL1 and CTRL2 are supplied by other logic circuitry (not shown) which may assert CTRL1 to set the output of first comparator 640 to high, irrespective of the input to first diode bridge 65 and/or may assert CTRL2 to set the output of second comparator 640 to high, irrespective of the input to second diode bridge 65.

Twin MP powering is detected responsive to detection of powering on all 4 twisted pairs 30 and detection of 2 class events, or the detection of 4 class event. In the event that class event counter 120 counts four class events, the TWIN MP input to OR gates 510 of FIG. 3 are asserted, responsive to OR gate 670. In the event that class event counter 120 counts two class events, which may be responsive to either a single medium power PSE 60 providing multiple class events or a pair of medium power PSE 60, output TPD of twin power detection circuit 600 is logically ANDed with the two class event counter by AND gate 660, thus ensuring that only in the event that all four twisted wire pairs 30 are powered will the TWIN MP input to OR gates 510 be asserted.

Figure 5:
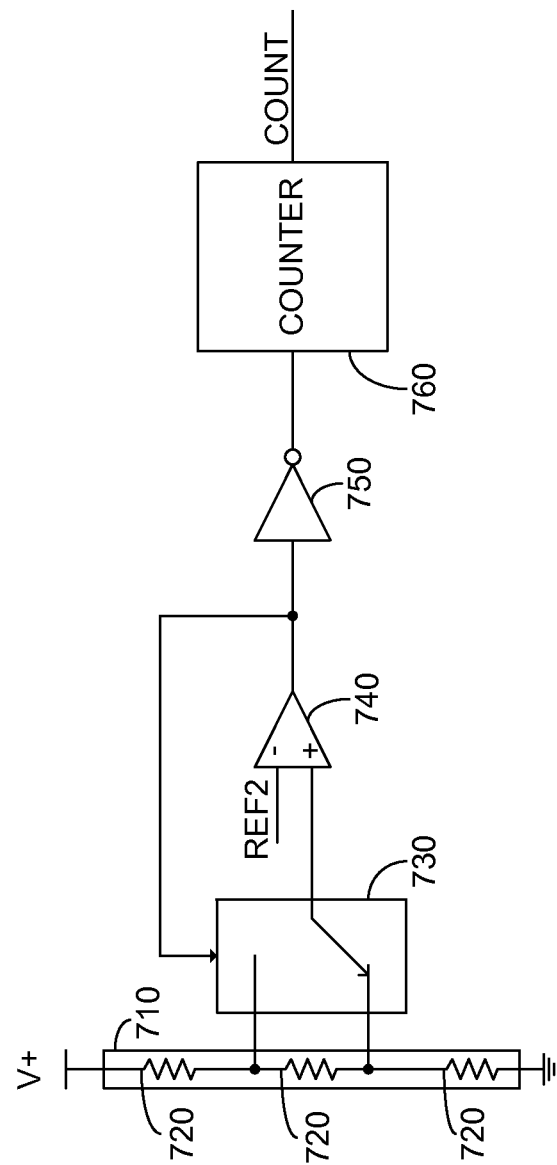
FIG. 5 illustrates a high level schematic diagram of an exemplary class event counter.

FIG. 5 illustrates a high level schematic diagram of an exemplary class event counter 700, comprising: a resistor divider 710, comprising a first, second and third resistor 720; an electronically controlled switch 730; a comparator 740; an inverter 750; and a counter 760. In one illustrated embodiment, electronically controlled switch 730 comprises a single pole, double throw switch. A first end of first resistor 720 is connected to an input voltage, denoted V+ and represents the positive output of diode bridges 65, i.e. the voltage across PD interface 500 of FIG. 3. A second end of first resistor 720 is connected to a first end of second resistor 720 and to a first terminal of electronically controlled switch 730. A second end of second resistor 720 is connected to a first end of third resistor 720 and to the second terminal of electronically controlled switch 730. The pole of electronically controlled switch 730 is connected to the non-inverting input of comparator 740 and the inverting input of comparator 740 is connected to a reference voltage, denoted REF2. The output of comparator 740 is connected to the control input of electronically controlled switch 730 and to the input of inverter 750. The output of inverter 750 is connected to the input of counter 760 and the output of counter 760 is denoted COUNT.

Resistor divider 710 provides a scaled voltage to the input of comparator 740, with electronically controlled switch 730 providing hysteresis to the non-inverting input of comparator 740 when alternately connected. When the voltage across PD interface 500 falls from the classification voltage sufficiently that the non-inverting input voltage is less than reference voltage REF2, a single positive edge pulse is received at counter 760 responsive to inverter 750, counting a single class event. Such a class event may be a mark event between consecutive class events, or the conclusion of a single class event, such as in the event of a low power PSE 60 meeting IEEE 802.3af. Additionally, electronically controlled switch 730 switches position so as to provide hysteresis responsive to the output of comparator 740. When the voltage across PD interface 500 rises to the classification voltage sufficiently that the non-inverting input voltage is greater than predetermined reference REF2, a single negative edge pulse is generated, switching electronically controlled switch 730 to the other position.

Figure 6:
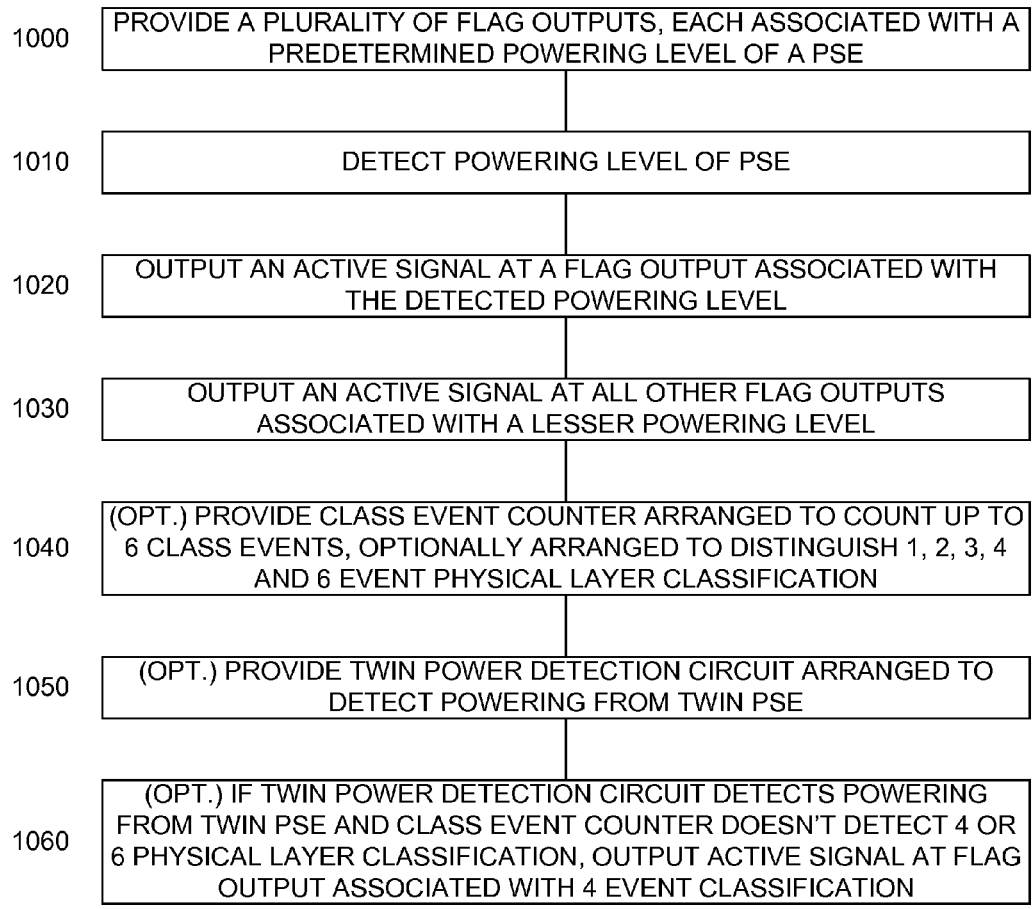
FIG. 6 illustrates a high level flow chart of an exemplary method of providing information to a powered device regarding power received from a power sourcing equipment over a structured communication cabling.

FIG. 6 illustrates a high level flow chart of an exemplary method of providing information to a powered device regarding power received from a PSE over a structured communication cabling. In stage 1000, a plurality of flag outputs are provided, each associated with a predetermined powering level of the PSE. In stage 1010, a powering level of the PSE is detected. In stage 1020, an active signal is output at a flag output associated with the detected powering level of stage 1010. In stage 1030, an active signal is output at all other flag outputs associated with a powering level less than the detected powering level of stage 1010.

In optional stage 1040, a class event counter is provided which is arranged to count up to 6 class events. Optionally, the provided class event counter is further arranged to distinguish 1, 2, 3, 4 and 6 event physical layer classification. Preferably, the provided class event counter is arranged to perform the powering level detection of stage 1010. In optional stage 1050, a twin power detection circuit is provided arranged to detect powering from a twin PSE. In optional stage 1060, in the event that the provided twin power detection circuit of optional stage 1050 detects powering from a twin PSE and the provided class event counter of optional stage 1040 does not detect 4 or 6 physical layer classification, an active signal is output at a flag output associated with 4 event classification.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

The invention claimed is:

1. A powered device interface arranged as an interface between power received from a power sourcing equipment over a structured communication cabling and a powered device, the powered device interface comprising:

a class event counter;

a logic circuit in communication with said class event counter; and a plurality of flag outputs each responsive to said logic circuit, each of said flag outputs associated with a predetermined powering level ability of the power sourcing equipment connected over the structured communication cabling, said logic circuit arranged to:
output an active signal at the flag output associated with a detected powering level ability of the connected power sourcing equipment; and
output an active signal at all other flag outputs associated with powering levels less than the detected powering level ability of the connected power sourcing equipment.

2. The powered device interface of claim 1, wherein the class event counter is arranged to count up to 6 event physical layer classification.

3. The powered device interface of claim 1, wherein the class event counter is arranged to distinguish 1, 2, 3, 4 and 6 event physical layer classification.

4. The powered device interface of claim 3, further comprising a twin power detection circuit in communication with said logic circuit and arranged to detect powering from twin power sourcing equipment.

5. The powered device interface of claim 4, wherein:
in the event that said twin power detection circuit detects powering from twin power sourcing equipment and said class event counter does not detect 4 or 6 physical layer classification, said logic circuit is arranged to output an active signal at a flag output associated with 4 event classification responsive to said twin power detection circuit.

6. A method of providing information to a powered device regarding power received from a power sourcing equipment over a structured communication cabling, the method comprising:
providing a plurality of flag outputs, each of said flag outputs associated with a predetermined powering level ability of the power sourcing equipment;
detecting the powering level ability of the power sourcing equipment;
outputting an active signal at a flag output of the provided plurality of flag outputs associated with the detected powering level ability of the connected power sourcing equipment; and
outputting an active signal at all other flag outputs associated with powering levels less than the detected powering level ability of the connected power sourcing equipment.

7. The method of claim 6, further comprising:
providing a class event counter arranged to count up to 6 event physical layer classification.

8. The method of claim 7, wherein the provided class event counter is arranged to distinguish 1, 2, 3, 4 and 6 event physical layer classification.

9. The method of claim 8, further comprising:
providing a twin power detection circuit arranged to detect powering from twin power sourcing equipment.

10. The method of claim 9, further comprising:
in the event that said twin power detection circuit detects powering from twin power sourcing equipment and said provided class event counter does not detect 4 or 6 physical layer classification, outputting an active signal at a flag output associated with 4 event classification responsive to said provided twin power detection circuit.

11. A powered device interface arranged as an interface between power received over a structured communication cabling and a powered device, the powered device interface comprising an interface circuitry arranged to:
output an active signal at the flag output associated with a detected powering level ability of the connected power sourcing equipment; and
output an active signal at all other flag outputs associated with powering levels less than the detected powering level ability of the connected power sourcing equipment.

* * * * *